(12) United States Patent
Phillips

(10) Patent No.: US 7,173,292 B2
(45) Date of Patent: Feb. 6, 2007

(54) FIELD EFFECT TRANSISTOR

(75) Inventor: Timothy Jonathan Phillips, Malvern (GB)

(73) Assignee: Qinetiq Limited (GB)

( * ) Notice: Subject to any disclaimer, the term of this patent is extended or adjusted under 35 U.S.C. 154(b) by 320 days.

(21) Appl. No.: 10/508,057

(22) PCT Filed: Mar. 17, 2003

(86) PCT No.: PCT/GB03/01148

§ 371 (c)(1),
(2), (4) Date: Sep. 17, 2004

(87) PCT Pub. No.: WO03/081674

PCT Pub. Date: Oct. 2, 2003

(65) Prior Publication Data

US 2005/0194613 A1    Sep. 8, 2005

(30) Foreign Application Priority Data

Mar. 20, 2002 (GB) ................................ 0206572.0

(51) Int. Cl.
*H01L 29/739* (2006.01)
(52) U.S. Cl. ........................................ 257/194; 257/24
(58) Field of Classification Search ................ 257/192, 257/194, 24, 615
See application file for complete search history.

(56) References Cited

U.S. PATENT DOCUMENTS

| 4,710,788 A | 12/1987 | Dambkes et al. |
| 5,023,674 A | 6/1991 | Hikosaka et al. |
| 5,286,662 A | 2/1994 | Kuwata |
| 5,331,185 A | 7/1994 | Kuwata |
| 5,334,865 A | 8/1994 | Fathimulla et al. |
| 5,856,217 A | 1/1999 | Nguyen et al. |

(Continued)

FOREIGN PATENT DOCUMENTS

EP    0 718 890    6/1996

(Continued)

OTHER PUBLICATIONS

Enoki, et al. "Design and Characteristics of InGa/As/InP Composite-Channel HFET's", IEEE Transactions on Electron Devices, pp. 1413-1418 (1995).

(Continued)

*Primary Examiner*—Mark V. Prenty
(74) *Attorney, Agent, or Firm*—McDonnell Boehnen Hulbert & Berghoff LLP

(57) ABSTRACT

In a field effect transistor having a quantum well is provided by a primary conduction channel, at least one secondary conduction channel immediately adjacent and in contact with the primary channel has an effect bandgap greater than the effective bandgap of the primary channel, and the modulus of the difference between the impact ionisation threshold IIT of the primary channel and the effective conduction band offset (the height of the step) between the primary and secondary channels being no more than 0.5 Eg (effective), or (alternatively) no more than 0.4 eV. Higher energy carriers which might otherwise cause impact ionization leading to runaway are thus diverted into the secondary channel allowing the device to run faster at increased voltages and/or to exhibit much greater resistance to runaway. The primary channel is prefereably of low bandgap material, for example InSb, InAs, $InAs_{1-y}$, $In_{1-x}Ga_xAs$.

26 Claims, 4 Drawing Sheets

U.S. PATENT DOCUMENTS

| | | | |
|---|---|---|---|
| 6,100,548 A | 8/2000 | Nguyen et al. | |
| 6,555,850 B1 * | 4/2003 | Sakamoto et al. | 257/192 |
| 2002/0030202 A1 | 3/2002 | Liu et al. | |

FOREIGN PATENT DOCUMENTS

| | | |
|---|---|---|
| EP | 0 803 912 | 10/1997 |
| EP | 1 030 371 | 8/2000 |
| GB | 2 362 506 | 11/2001 |
| JP | 9 139493 | 5/1997 |
| JP | 9 283 745 | 10/1997 |

OTHER PUBLICATIONS

Akazaki, et al. "Improved InAlAs/InGaAx HEMT Characteristics by Inserting an InAs Layer into the InGaAs Channel", IEEE Electron Device Letters, pp. 325-327 (1992).

Akazaki, et al. "Improving the Characteristics of an InAlAs/InGaAs Inverted HEMT by Inserting an InAs Layer into the InGaAs Channel", Solid State Electronics, p. 997-1000, (1995).

Karlsson, et al "Metamorphic HFET's with composite In0.8Ga0.2As/InAs/In0.8Ga0.2As Channels on GaAs Substrate", Proceedings of the IEEE, pp. 483-486 (1997).

Uppal, et al. "Transport Properties of Heterostructures Based on GASB, INAS and INSB on GAAS Substrates", Journal of Crystal Growth, pp. 623-627 (1991).

* cited by examiner

FIELD EFFECT TRANSISTOR

This invention relates to field effect transistors (FETs) and in particular to quantum well field effect transistors, also known as MODFETs (modulation doped field effect transistors) or HEMTs (high electron mobility transistors).

MODFETs are characterised by a conduction channel of low bandgap material bounded by material with a higher bandgap, so that the conduction channel provides a quantum well region for carrier transport between drain and source regions. A gate electrode structure is provided for controlling the number of current carriers in the conduction channel, and thus its conductivity. The gate structure may be of a metal-insulator-semiconductor construction, or may comprise a Schottky diode, for example.

Typical examples of MODFETs are disclosed in European Patent Application serial number EP 0523731 (Sumitomo); U.S. Pat. No. 6,100,548 (Nguyen); U.S. Pat. No. 5,856,217 (Nguyen); U.S. Pat. No. 5,334,865 (Fathimulla); U.S. Pat. No. 5,331,185 (Kuwata); U.S. Pat. No. 5,286,662 (Kuwata); U.S. Pat. No. 5,023,674 (Hikosaka); and U.S. Pat. No. 4,710,788 (Dambkes).

In a MODFET the conduction channel possesses an essentially single-crystal lattice so that the carriers have a relatively long mean free path, and a correspondingly high mobility. The material of the conduction channel is commonly substantially undoped or very lightly doped to maximise the carrier mobility, velocity and mean free path, although more highly doped materials are sometimes used. The high carrier mobility in MODFETs renders them particularly suitable for high-speed use.

Low band gap materials such as indium arsenide (InAs), indium antimonide (InSb), and indium gallium arsenide (InGaAs) are particularly suitable for use in MODFETs, with indium antimonide being particularly advantageous for ultra high-speed applications since it has low electron effective mass, very high electron mobility, a large ballistic mean free path and a high saturation velocity.

FIG. 1 shows in schematic outline form the structure of a MODFET. Lying between conductive doped source and drain regions 3, 4 is a region 2 which includes a discrete layer 5 between wider bandgap lower and upper layers 6, 7 respectively. Layer 5 provides a quantum well region 8 and in practice it is conventionally grown epitaxially on the layer 6 so as to form a single crystal lattice. Source, gate and drain electrodes 9, 10, 11 are provided over the corresponding regions 3, 2, 4.

The material(s) of the substrate or layer 6 and that of layer 7 have large bandgaps, while the material of layer 5 has a low bandgap, thereby forming with layers 6 and 7 a quantum well heterostructure for current conduction. Layer 7, and often also layer 6, is doped to supply or transmit carriers by modulation doping to the layer 5 providing the well region 8. The material of layer 5 is preferably undoped, or has very little doping, although some quantum well transistors do employ conduction channels with relatively highly doped materials.

The corresponding bandgap distribution along the line A—A of FIG. 1 is shown schematically in FIG. 2, where the upper line 12 denotes the edge of the conduction band and the lower line 13 denotes the edge of the valence band. The material of layer 5 has a narrow band gap 14. The layers 6 and 7 are of the same material and their bandgap 15 is sufficiently large to ensure that carriers therein will normally never attain sufficient energy to enter its conduction band, so carriers remain confined in the well. Thus layer 5 defines with the surrounding wide bandgap layers 6, 7 a quantum well region 8 of width w. It will be observed that since the quantum well region 8 in this case comprises a single uniform conducting layer 5, the sides 16 of the well are ideally substantially vertical. A dotted line 17 shows the height of the impact ionisation threshold within the quantum well. The impact ionisation threshold (not shown) for layers 6 and 7 lies above the edge 12 of their conduction bands.

Although it is possible by varying the composition at the edges of the well region 8 to produce quantum wells with non-vertical sides, so that the bandgap changes in a more continuous manner, in the present invention it is preferred to have a sharp change in bandgap at the well sides.

In operation of the quantum well FET of FIG. 1, when the bias applied to the gate electrode 10 is such that the transistor is on, the population of carriers in the quantum well region 8 is sufficient that current will flow in the conduction channel if an appropriate potential difference $V_{DS}$ is applied between the drain and source electrodes 9, 11. The current will dependent on the magnitude of $V_{DS}$, but as the value of $V_{DS}$ reaches a threshold level the energy of the carriers in the well reaches the impact ionisation threshold 17 and additional carriers begin to be created. If the value of $V_{DS}$ rises beyond this point a significant number of additional current carriers are generated, eventually leading to avalanche breakdown. In this process, all the carriers continue to be confined in the quantum well region 8 because of the high bandgap 15 presented by the material of adjacent layers 6, 7, although escape of the carriers into the barriers is possible if a sufficiently high bias is applied.

This is illustrated in FIG. 3, which shows a graph of drain current $I_D$ as a function of drain voltage $V_D$, notionally divided into three regions 18 to 20 separated by knees. As the drain voltage $V_D$ is increased, an initial region 18 (called the "linear region") is followed by a region 19 of relatively low slope, where the rise in drain current with drain voltage is small. Region 19 is called the "saturation region", and is the region of normal operation. As the current increases still further impact ionisation generates additional carriers until region 20 is reached where avalanche breakdown commences and the current rises more steeply, to an extent which may damage the device. The upper limit of region 19 is therefore limited by the onset of avalanche breakdown.

Avalanche breakdown not only leads to loss of control of the transistor in response to the gate bias voltage, but it can produce thermal runaway, threatening the device and possibly associated components.

Avalanche breakdown is a phenomenon common in many types of semiconductor device, and indeed is used to good effect in devices such as Zener diodes. However, it does give rise to particular problems in the context of MODFETs which employ low bandgap materials with high carrier mobilities such as indium antimonide. Because the impact ionisation threshold is essentially the material bandgap, in low bandgap materials the fields from relatively low voltages $V_{DS}$ give rise to avalanche breakdown. The low threshold value of $V_{DS}$ which produces breakdown with such low bandgap materials is highly undesirable and at present is a significant limitation in high frequency, high voltage applications.

Furthermore, even at lower energy levels impact ionisation in field effect transistors can gives rise to the kink effect, where holes gather under the source, see for example Armstrong et al, Solid State Electronics, Vol. 39(9), p 1337, 1996. The kink effect increases the output conductance, limiting the capacity to drive further devices even under more moderate operating conditions.

It will therefore be understood that in field effect transistors there is a trade off between switching speed—which requires high carrier velocities and mobilities and hence a lower band gap, and breakdown voltage—which requires a higher band gap. Thus a problem exists when it is necessary to drive an FET with a relatively high voltage for powering subsequent stages (e.g. in systems such as modulators and amplifiers, or FET-based logic) while retaining a useful high frequency gain. Such considerations are of particular importance for example in mobile communications devices where high power high frequency signal amplification is required for radio frequency signal transmission. There is therefore a requirement for high frequency field effect transistors operable at relatively high voltages.

In a quantum well field effect transistor according to the present invention the quantum well is provided by a primary conduction channel and at least one secondary conduction channel immediately adjacent and in contact with the primary channel, the secondary channel having a bandgap greater than that of the primary channel. According to the invention the conduction band of the secondary channel is close to the impact ionisation threshold IIT of the first channel. As discussed in more detail below, preferably the modulus of the difference between the impact ionisation threshold IIT and the effective conduction band offset $\Delta E_C$ (effective) between the primary and secondary channels being no more than 0.5 Eg (effective). Alternative preferences are for the modulus of the difference between the impact ionisation threshold IIT and the effective conduction band offset $\Delta E_C$ (effective) between the primary and secondary channels to be no more than 0.4 eV, or no more than the lower of 0.5 Eg (effective) and 0.4 eV.

Composite quantum well channel FETs are known, examples being disclosed in, for example, European Patent Application No. 1030371 (Sumitomo); Japanese Patent Application No. 9283745 (Oki) and the article "Design Characteristics of InGaAs/InP Composite Channel HFETs", Takatomo Enoki et al, IEE Trans. Electron Devices, 45(8), August 1995. However, in none of these is the impact ionisation threshold IIT close to the effective conduction band offset $\Delta E_C$ (effective) between the primary and secondary channels.

It will be appreciated that the energies of the carriers are spread over a range, and that initially there will be relatively few carriers of sufficiently high energy to cross the impact ionisation threshold, the number of such carriers increasing with applied voltage (potential difference). In a construction according to the present invention, it is believed that at least some of the carriers which would otherwise reach the impact ionisation threshold of the first channel are diverted to a secondary conduction channel, and impact ionisation and the tendency to runaway are accordingly reduced.

Since the secondary conduction channel commonly will not show the same advantageous characteristics of the primary channel, for example switching speed, it will be understood that the precise choice of energy levels for a particular transistor according to the invention will represent a trade-off between speed and the onset of significant impact ionisation. Nevertheless, compared with a prior art device having no secondary channel it is possible to obtained an improved switching speed, by increasing the applied voltage, for the same degree of impact ionisation, and/or to obtain a reduction in susceptibility to impact ionisation, e.g. at a voltage where impact ionisation in the prior art device has become unacceptable.

FIG. 9 illustrates energy levels which might occur in the quantum well region of a transistor according to the invention. Electrons in a primary conduction channel 35 cannot occupy a level lower than the first sub-band 34 (the Fermi level) of that channel, which lies an amount $E_1$ above the energy zero of that channel. Similarly electrons in an adjacent secondary conduction channel 37 cannot occupy a level lower than the first sub-band 36 of channel 37, an amount $E_1'$ above the energy zero thereof. Thus the effective bandgap in region 35 is given by Eg (effective)=Eg+$E_1$.

Preferably the material of the conduction channel has an effective bandgap Eg no greater than 0.75 eV, more preferably no greater than 0.6 eV, even more preferably no greater than 0.5 eV, and most preferably no greater than 0.4 eV.

The effective conduction band offset between the primary and secondary channels is given by $\Delta E_C$ (effective)=$\Delta E_C$+$E_1'$−$E_1$, where $\Delta E_C$ is the difference between the absolute energy zeroes of the channels. The effective impact ionisation threshold IIT (effective)=Eg+$E_1$=Eg (effective). Later references in the specific description to energy levels and differences should be read as to the effective values.

Particularly because of the trade-off in performance and susceptibility to impact ionisation it is presently preferred to arrange for $\Delta E_C$ (effective) to be relatively close to the impact ionisation threshold IIT (effective). In particular it is preferred that the difference between IIT (effective) and $\Delta E_C$ (effective) is no more than 0.5 Eg (effective), more preferably no more than 0.25 Eg (effective), even more preferably no more than 0.125 Eg (effective), and most preferably no more than 0.05 Eg (effective).

The difference IIT (effective)−$\Delta E_C$ (effective) may be positive, in which case higher energy carriers with an energy less than IIT will be diverted to a secondary channel with lower performance but improved avoidance of impact ionisation; or the difference may be negative in which case some impact ionisation may occur prior to occupation of a secondary channel, but only to an acceptable extent and with filler use of the superior characteristics of the primary channel. As implied above, at present it is believed that a substantial matching of IIT (effective) and $\Delta E_C$ (effective) is a good, or the best, compromise. Thus an alternative way of defining a preferred value of $\Delta E_C$ (effective) is to say that the difference between IIT (effective) and $\Delta E_C$ (effective) is no more than 0.4 eV, more preferably no more than 0.3 eV, more preferably no more than 0.2 eV, and most preferably no more than 0.1 eV. Again the sign of the difference will affect performance as outlined above.

While the invention covers transistors where only one secondary channel is provided, preferably on the opposite side of the primary channel from a gate of the transistor, the provision of two secondary channels provides further space for high energy carriers to occupy. In one form of embodiment, the two secondary conduction channels are of equal thickness.

Further features and advantages of the invention will become clear to the reader upon a perusal of the appended claims, and upon a reading of the following more detailed and specific description of embodiments of the invention, made with reference to the accompanying figures, in which:

Figure 1:
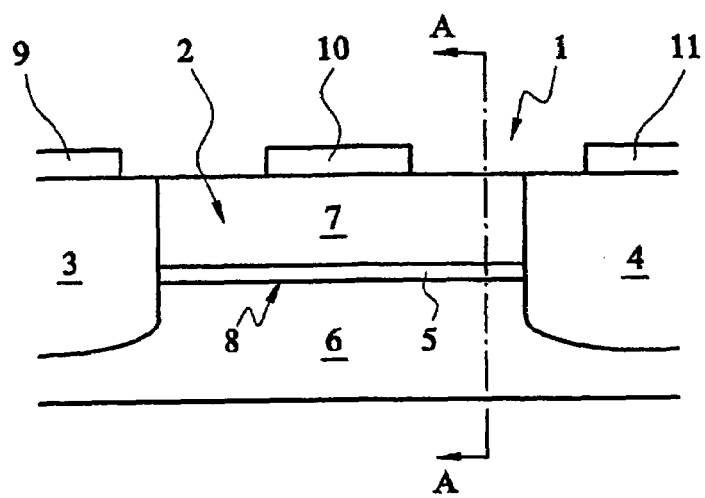
FIG. 1 is an idealised schematic vertical cross section through a prior art quantum well FET.

Where appropriate in the drawings like references have been used for like features.

Figure 2:
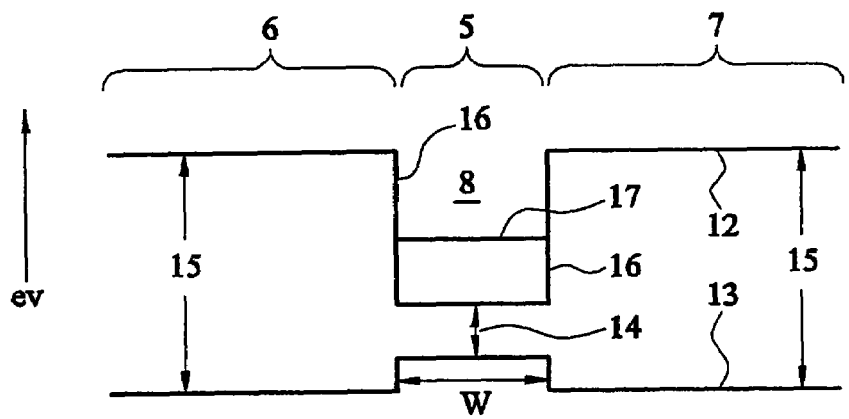
FIG. 2 is a bandgap energy diagram for the FET of FIG. 1 taken along the line A—A of FIG. 1.
Figure 3:
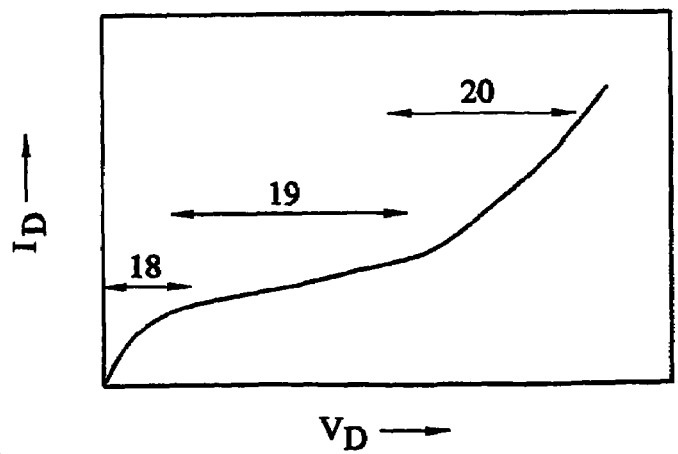
FIG. 3 shows a graph of drain current $I_D$ as a function of drain voltage $V_D$ of a conventional FET illustrating avalanche breakdown effects.
Figure 4:
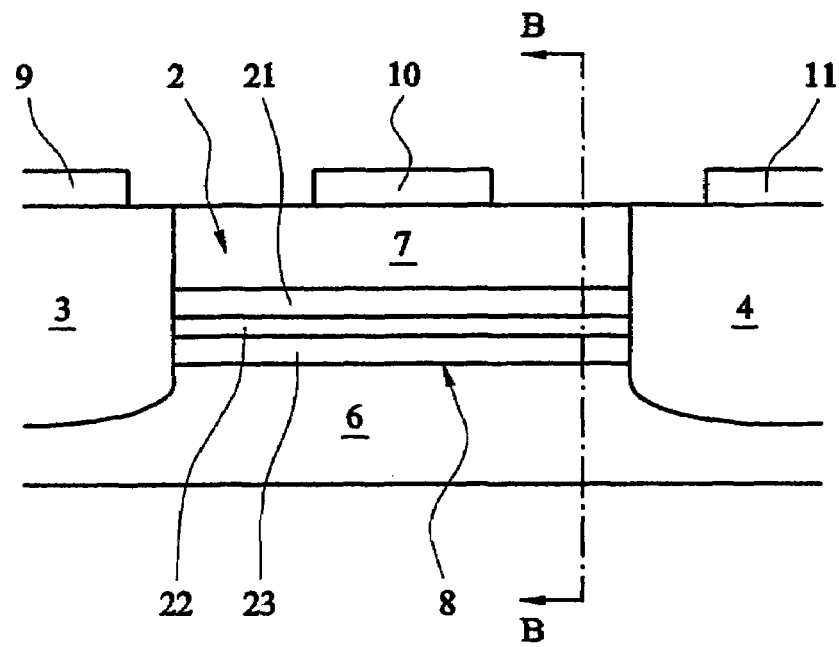
FIG. 4 is an idealised schematic partial vertical cross section through a first outline embodiment of quantum well FET according to the invention.

FIG. 4 shows a schematic outline vertical cross section through an FET generally similar to that of the FET of FIG. 1 but constructed according to the invention. It differs in that the quantum well region 8 is now composed of a plurality of layers 21, 22, 23 of different materials as opposed to the single homogeneous layer 5 of FIG. 2. The central layer 22 is similar to the layer 5 of FIG. 2, and provides a primary conduction channel, but it is now bounded on either side by layers 21, 23 which provide secondary conduction channels. These are formed of a material having a greater bandgap than layer 22 with a conduction band edge which is approximately equal in energy to the impact ionisation threshold of layer 22. The bandgap of the material of layers 21, 23 is less than that of the layers 6, 7. Optionally, the electrode layer 10 is underlain by a dielectric layer, or is in the form of a Schottky diode in known manner.

Preferably the layers 21, 23 are (a) of equal thickness, (b) of the same material and (c) have the same bandgap; however, none of these features is strictly necessary.

Figure 5:
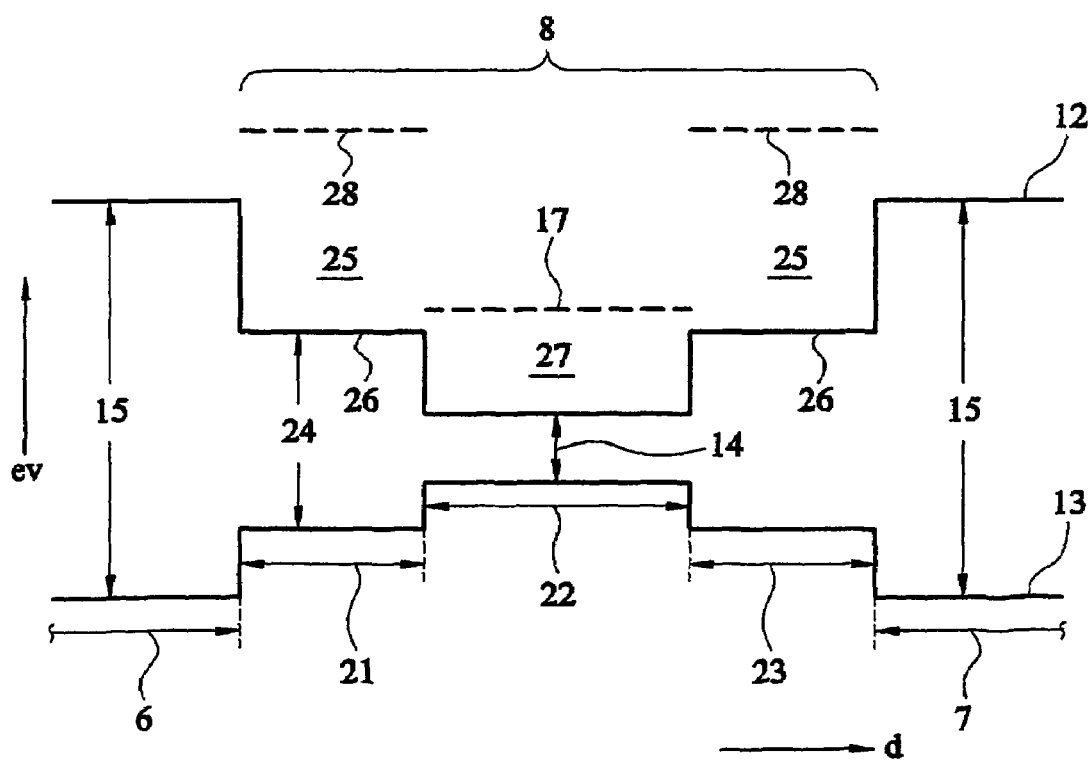
FIG. 5 is a bandgap energy diagram for the FET of FIG. 4 taken along the line B—B.

The bandgap distribution along the line B—B of FIG. 4 is shown in FIG. 5. The material of layers 21, 23 has a bandgap 24 with a conduction band commencing at a level 26, the magnitude of both the bandgap and the conduction band edge being intermediate those of the central layer 22 and the widest bandgap material of the layers 6, 7. The impact ionisation threshold of layers 21, 23 is shown at 28.

It will be seen that the quantum well region 8 thus defined comprises a primary conduction channel 27 and adjacent secondary conduction channels 25. For an InSb-based FET, with no strain and quantisation effects included, the bandgaps 14, 24 and 15 typically have values of 0.178, 0.445 and 0.773 eV respectively. With strain and quantisation effects included, the effective bandgaps 14, 24 and 15 typically have values of 0.220, 0.559 and 0.872 eV respectively for a 20 nm wide primary well.

In use, the carriers are initially essentially confined to the primary conduction channel 27. As the potential difference between the source and drain electrodes is increased, their energy of carriers approaches the impact ionisation threshold 17. However, once the energy exceeds the level of the conduction band 26, the carriers can also occupy the secondary channels 25, which have a higher impact ionisation threshold. The result is a reduction in impact ionisation. Where two channels 25 of width equal to the primary channel 27 are present, the reduction is a factor of approximately three. As in FIG. 2, the high bandgap layers 6, 7 continue to confine the electrons within the quantum well region 8.

While the secondary channels 25 are made from higher bandgap material, and therefore have a rather lower electron mobility relative to the primary channel, they can still have a good electron velocity. Since at low field all the electrons remain in the primary channel 27, the lower field mobility in channels 25 is not so important to the efficient functioning of the transistor.

Although it is preferred, it is not necessary to have a secondary channel on each side of the primary channel. One or other of the layers 21, 23 may be omitted, in which case the well is preferably located between the remaining secondary channel and the gate. However with a single secondary channel there is a corresponding increase in impact ionisation.

The energy level plot is not necessarily symmetrical about the quantum well. Thus in FIG. 5 for example the two levels 26, although shown as being equal, may be different, so that the quantum well effectively widens on one side and then the other with increasing carrier excitation.

Furthermore, between any secondary channel and the substrate or substrate layer there may be provided one or more (successive) tertiary channels with increasing conduction band levels, etc., so that they act in a manner similar to that of the secondary channel in permitting the quantum well to become increasingly wide with increasing excitation of the carriers. Again the additional energy levels thus provided can be the same or different when there are tertiary channels provided on both sides of the quantum well.

Figure 6:
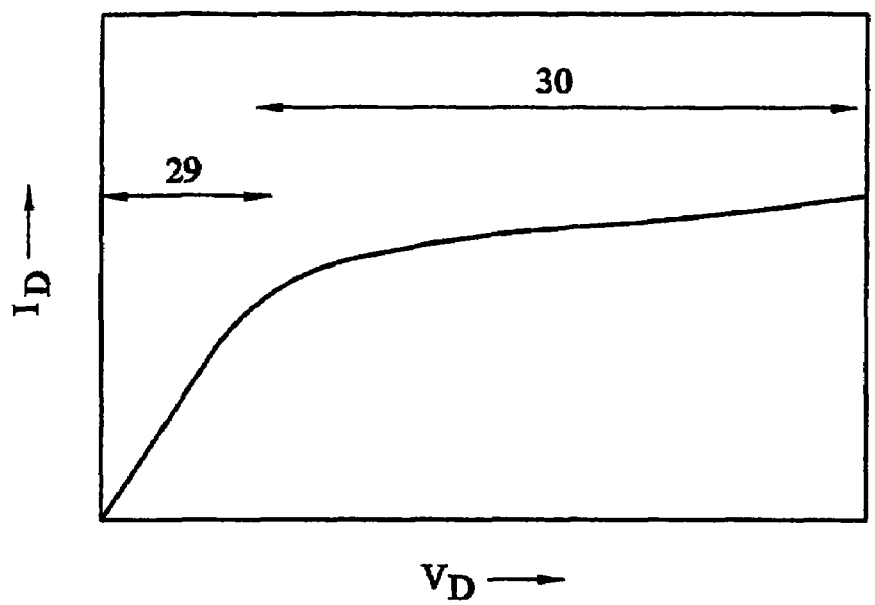
FIG. 6 shows a graph of drain current $I_D$ as a function of drain voltage $V_D$ of the FET of FIG. 5 illustrating the suppression of avalanche breakdown.

The plot of $I_D$ against $V_D$ for a transistor according to the invention is shown in FIG. 6. Following the initial linear region 29 of relatively high slope the saturation region 30 extends to higher values of $V_D$ than in the prior art device, due to the reduction in impact ionisation, and leading to a larger range of operation.

Although the basic invention is described above, further improvements and advantages can be envisaged. For example, placing the channel doping atoms in the surrounding channel areas 21, 23 will tend to reduce the mobility here, providing a negative channel conductance effect which will further counteract the increase in channel conductance due to the impact ionisation, and making devices with even harder (i.e. lower slope) output characteristics.

Figure 7:
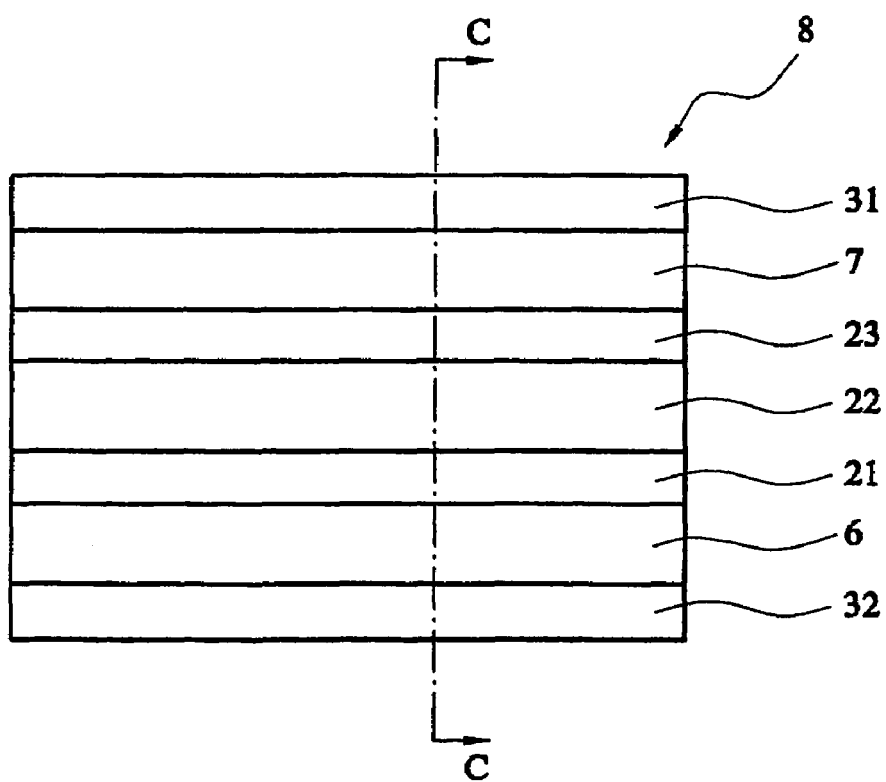
FIG. 7 is an idealised schematic partial vertical cross section through the well region of a second embodiment of a quantum well FET according to the invention, in more detail than that of FIG. 4.
Figure 8:
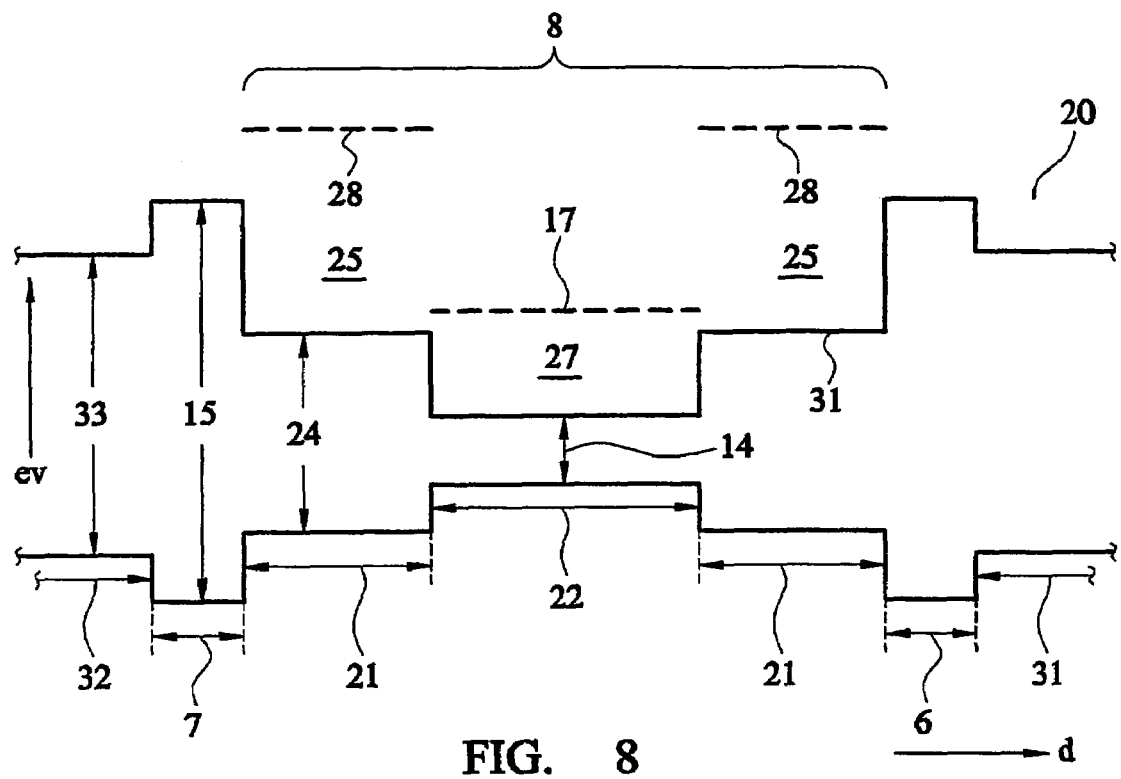
FIG. 8 is a bandgap energy diagram for the FET of FIG. 7 taken along the line C—C.
Figure 9:
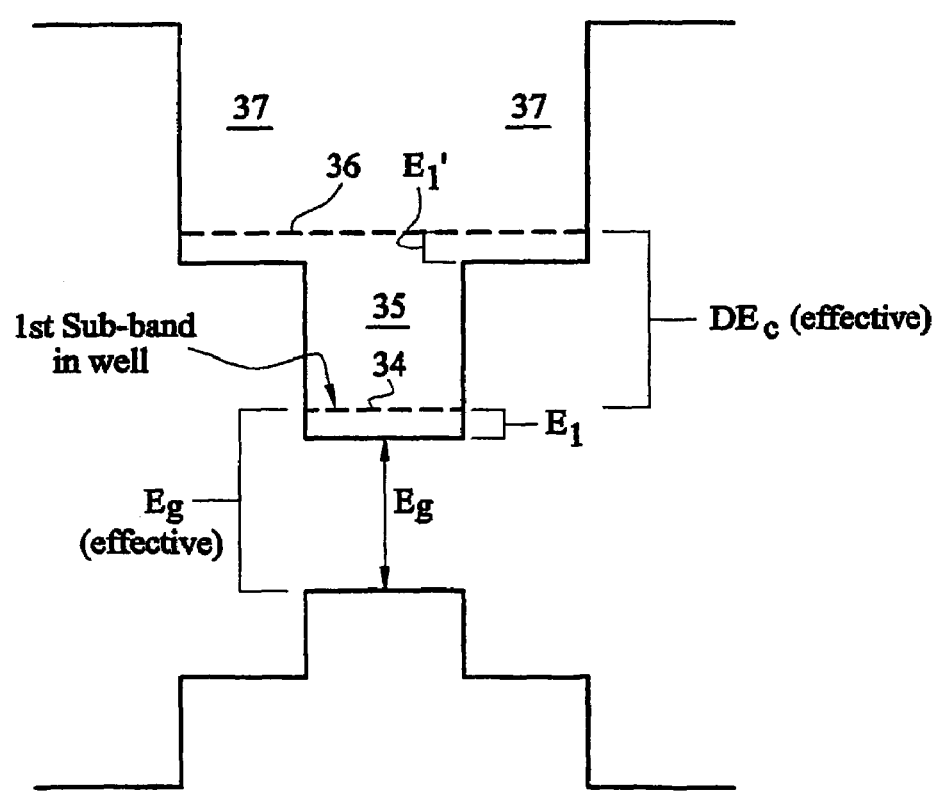
FIG. 9 is a diagram illustrating the effective bandgap in a quantum well with quantisation effects included.

FIG. 7 illustrates the well region of a transistor which is similar to that of FIG. 4, but modified in that the high bandgap layers are restricted in thickness and bounded on their outer surfaces by lower bandgap 33 regions 31, 32. By way of example only, the regions 31 and 32 may be made of the same materials as that of regions 21 and 23, with the same bandgap. The corresponding bandgap distribution for such an example is shown in FIG. 8. For an InSb-based FET with no strain or quantisation effects included the bandgaps 14, 15, 24 and 33 typically have values of 0.178, 0.773, 0.445 and 0.445 eV respectively. With strain and quantisation effects included, the effective bandgaps 14, 15, 24 and 33 typically have values of 0.220, 0.872, 0.559 and 0.559 eV respectively for a 20 nm wide primary well.

In one example of a well region 8 of an FET according to the invention and as shown schematically in FIG. 7, the 200 Å thick central primary conduction channel 27 (22) is of undoped indium antimonide, and is bounded by 200 Å thick secondary conduction channels 25 (23, 23) of $In_{0.85}Al_{0.15}Sb$, which also provides the outermost regions 31, 32. The 200 Å thick high bandgap regions 6, 7 are of $In_{0.70}Al_{0.30}Sb$. This then provides a structure that is strain balanced at the lattice constant of the $In_{0.85}Al_{0.15}Sb$. It should be noted that in all cases the layers are nominally undoped, but may contain unintentional doping of either type. The channel doping may be provided by δ-doping layers placed above and/or below the central well, or by doping any part of the structure n-type.

When holes are generated in the impact ionisation process, they tend to collect under the source, thereby producing the kink effect mentioned above, and which commonly occurs in narrow bandgap devices. This effect may be alleviated or avoided in transistors according to the invention for example by confining the holes in a valence band so that they are removed at the source contact and/or by providing a back contact arranged so that the holes will move preferentially towards the back of the transistor for removal.

The invention claimed is:

1. A quantum well field effect transistor wherein the quantum well is provided by a primary conduction channel and at least one secondary conduction channel adjacent and in contact with the primary channel, the secondary channel having an effective bandgap greater than the effective bandgap Eg (effective) of the primary channel, wherein the modulus of the difference between the effective impact ionisation threshold IIT (effective) of the primary channel and the effective conduction band offset $\Delta E_c$ (effective) between the primary and secondary channels is not more than 0.5 Eg (effective).

2. A transistor according to claim 1 wherein the modulus is no more than 0.25 Eg (effective).

3. A quantum well field effect transistor wherein the quantum well is provided by a primary conduction channel and at least one secondary conduction channel adjacent and in contact with the primary channel, the secondary channel having an effective bandgap greater than the effective bandgap Eg (effective) of the primary channel, wherein the modulus of the difference between the effective impact ionisation threshold IIT (effective) of the primary channel and the effective conduction band offset $\Delta E_c$ (effective) between the primary and secondary channels is not more than 0.25 Eg (effective).

4. A transistor according to claim 3 wherein the modulus is no more than 0.3 eV.

5. A transistor according to claim 3 wherein the difference is positive.

6. A transistor according to claim 3 wherein the bandgap of the material of the primary channel is less than 0.75 eV.

7. A transistor according to claim 3 wherein the secondary conduction channel is on each side of the primary channel.

8. A transistor according to claim 3 having a gate on the opposite side of the primary channel from the secondary conduction channel.

9. A transistor according to claim 3 wherein the quantum well further comprises at least one tertiary channel, the at least one secondary channel being located between and in contact with the primary channel and the tertiary channel, the tertiary channel having an effective bandgap greater than that of the secondary channel with which it is in contact and a conduction band edge approximately equal in energy to the impact ionisation threshold of the secondary channel with which it is in contact.

10. A transistor according to claim 3 wherein the material of the primary channel has an effective conduction band offset $\Delta E_c$ (effective) which is equal or greater than its effective bandgap Eg (effective).

11. A transistor according to claim 3 where the primary channel is formed from InSb, InAs, $InAs_{1-y}Sb_y$, $In_{1-x}Ga_xSb$ or $In_{1-x}Ga_xAs$.

12. A transistor according to claim 3 wherein channel doping is provided in the secondary channel.

13. A transistor according to claim 3 and constructed so that holes are confined in a valence band well for removal at the source contact.

14. A transistor according to claim 3 and provided with a substrate contact for removal of holes.

15. A quantum well field effect transistor wherein the quantum well is provided by a primary conduction channel and at least one secondary conduction channel immediately adjacent and in contact with the primary channel, the secondary channel having an effective bandgap greater than the effective bandgap Eg (effective) of the primary channel, wherein the modulus of the difference between the effective impact ionisation threshold IIT (effective) of the primary channel and the effective conduction band offset $\Delta E_c$ (effective) between the primary and secondary channels is not more than 0.4 eV.

16. A transistor according to claim 15 wherein the modulus is no more than 0.3 eV.

17. A transistor according to claim 15 wherein the difference is positive.

18. A transistor according to claim 15 wherein the bandgap of the material of the primary channel is less than 0.75 eV.

19. A transistor according to claim 15 wherein the secondary conduction channel is on each side of the primary channel.

20. A transistor according to claim 15 having a gate on an opposite side of the primary channel from the secondary conduction channel.

21. A transistor according to claim 15 wherein the quantum well further comprises at least one tertiary channel, the at least one secondary channel being located between and in contact with the primary channel and the tertiary channel, the tertiary channel having an effective bandgap greater than that of the secondary channel with which it is in contact and a conduction band edge approximately equal in energy to the impact ionisation threshold of the secondary channel with which it is in contact.

22. A transistor according to claim 15 wherein the material of the primary channel has an effective conduction band offset $\Delta E_c$ (effective) which is equal or greater than its effective bandgap Eg (effective).

23. A transistor according to claim 15 where the primary channel is formed from InSb, InAs, $InAs_{1-y}Sb_y$, $In_{1-x}Ga_xSb$ or $In_{1-x}Ga_xAs$.

24. A transistor according to claim 15 having doping in the secondary channel.

25. A transistor according to claim 15 having a source contact and constructed for confining holes in a valence band well for removal at the source contact.

26. A transistor according to claim 15 having a substrate contact for removal of holes.

* * * * *